(12) United States Patent
Ritter

(10) Patent No.: US 12,231,150 B2
(45) Date of Patent: Feb. 18, 2025

(54) METHOD FOR TESTING AN ANALOG-TO-DIGITAL CONVERTER UNIT HAVING DELTA-SIGMA MODULATION

(71) Applicant: Robert Bosch GmbH, Stuttgart (DE)

(72) Inventor: Rudolf Ritter, Esslingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 183 days.

(21) Appl. No.: 17/998,965

(22) PCT Filed: Aug. 5, 2021

(86) PCT No.: PCT/DE2021/100675
§ 371 (c)(1),
(2) Date: Nov. 16, 2022

(87) PCT Pub. No.: WO2022/028657
PCT Pub. Date: Feb. 10, 2022

(65) Prior Publication Data
US 2023/0198545 A1   Jun. 22, 2023

(30) Foreign Application Priority Data
Aug. 5, 2020   (DE) ............ 10 2020 209 852.2

(51) Int. Cl.
*H03M 3/00* (2006.01)
(52) U.S. Cl.
CPC ........... *H03M 3/378* (2013.01); *H03M 3/458* (2013.01)

(58) Field of Classification Search
CPC ...................... H03M 3/378; H03M 3/458
See application file for complete search history.

(56) References Cited

U.S. PATENT DOCUMENTS

| | | | | |
|---|---|---|---|---|
| 6,313,774 B1 * | 11/2001 | Zarubinsky | ........... | H03M 3/412 |
| | | | | 341/143 |
| 6,334,219 B1 * | 12/2001 | Hill | ........ | H04H 60/11 |
| | | | | 341/100 |
| 6,414,615 B1 * | 7/2002 | Cheng | .............. | H03M 3/37 |
| | | | | 341/143 |
| 6,557,131 B1 * | 4/2003 | Arabi | ............ | H03M 1/109 |
| | | | | 714/733 |

(Continued)

OTHER PUBLICATIONS

International Search Report for PCT/DE2021/100675, Issued Jan. 21, 2022.

(Continued)

*Primary Examiner* — Lam T Mai
(74) *Attorney, Agent, or Firm* — NORTON ROSE FULBRIGHT US LLP; Gerard A. Messina

(57) ABSTRACT

A method for testing an analog-to-digital converter unit, which is equipped to convert an analog input signal into a digital output signal with the aid of delta-sigma modulation. The method includes: generating an analog input signal; applying a predefined interference signal to the analog input signal and storing the resulting digital output signal as test result; determining that a fault is present if a transfer function of the analog-to-digital converter unit, which is ascertained from the test result and the input signal, has a deviation from a predefined target transfer function that is greater than a predefined reference value, a fault signal being output if a fault is determined.

8 Claims, 1 Drawing Sheet

(56) References Cited

U.S. PATENT DOCUMENTS

| | | | | | |
|---|---|---|---|---|---|
| 7,196,645 | B2* | 3/2007 | Bock | | H03M 1/1004 |
| | | | | | 341/120 |
| 8,166,362 | B2* | 4/2012 | Meagher | | G01R 31/2846 |
| | | | | | 714/741 |
| 9,531,402 | B1* | 12/2016 | Kim | | H03M 3/436 |
| 9,780,803 | B1* | 10/2017 | Bal | | H03M 1/1071 |
| 10,014,875 | B1* | 7/2018 | Zanikopoulos | | H03M 1/1076 |
| 11,606,099 | B1* | 3/2023 | Raju | | H03M 1/0678 |
| 2003/0184459 | A1* | 10/2003 | Engl | | G11C 27/026 |
| | | | | | 341/120 |
| 2006/0077081 | A1* | 4/2006 | Bock | | H03M 1/1004 |
| | | | | | 341/118 |
| 2007/0139240 | A1* | 6/2007 | Mitteregger | | H03M 3/37 |
| | | | | | 341/143 |
| 2007/0216557 | A1* | 9/2007 | Ebner | | H03M 3/384 |
| | | | | | 341/143 |
| 2014/0009185 | A1* | 1/2014 | Tsuda | | H03M 3/378 |
| | | | | | 324/762.01 |
| 2015/0123675 | A1* | 5/2015 | Martini | | G01R 31/72 |
| | | | | | 324/546 |
| 2016/0359499 | A1* | 12/2016 | Bandyopadhyay | | H03M 3/458 |
| 2019/0386673 | A1* | 12/2019 | Schrattenecker | | H03M 1/1071 |
| 2021/0305996 | A1* | 9/2021 | Kinyua | | H03M 3/462 |
| 2022/0247426 | A1* | 8/2022 | Ritter | | H03M 3/422 |

OTHER PUBLICATIONS

De Venuto et al., "Testing High Resolution ΣΔADC's by Using the Quantizer Input as Test Access," Microelectronics Journal, Mackintosh Publications Ltd. Luton, GB, vol. 36, No. 9, 2005, pp. 810-819. <https://www.academia.edu/72455543/Testing_high_resolution_%CE%A3%CE%94_ADCs_by_using_the_quantizer_input_as_test_access?auto=download> Downloaded Nov. 15, 2022.

* cited by examiner

METHOD FOR TESTING AN ANALOG-TO-DIGITAL CONVERTER UNIT HAVING DELTA-SIGMA MODULATION

FIELD

The present invention relates to a method for testing an analog-to-digital converter unit. The analog-to-digital converter unit in this case is based on delta-sigma modulation. In addition, the present invention relates to an analog-to-digital converter unit having a corresponding self-test module.

BACKGROUND INFORMATION

Analog-to-digital converter units are familiar from the related art. Such analog-to-digital converter units may be based on a delta-sigma modulation, in which a closed loop is implemented, the analog input signal being quantized in order to subsequently correct the quantization error. Such analog-to-digital converter units offer the potential for very high accuracy, the quality of the analog-to-digital conversion being dependent on the quality of the closed loop implemented.

SUMMARY

A method of the present invention permits accurate testing of an analog-to-digital converter unit based on delta-sigma modulation. In particular, dead bands in the transfer function of the analog-to-digital converter unit may thus be determined reliably and with reduced expenditure using the method. As a result, high accuracy of the analog-to-digital conversion is able to be realized and guaranteed. In particular, preferably a test of the closed loop is carried out using the method, since this significantly influences the effects on the transfer function. Consequently, other influences may be ignored, thus avoiding a time-consuming check of an entire input-output behavior of the analog-to-digital converter unit.

According to an example embodiment of the present invention, the method for testing an analog-to-digital converter unit, which is equipped to convert an analog input signal into a digital output signal with the aid of the delta-sigma modulation, has the following steps: First of all, an analog input signal is generated which is used as test signal. In addition, a predefined interference signal is applied to the analog input signal, a resulting digital output signal being stored as test result. Finally, a fault is ascertained based on a deviation from a predefined target transfer function. To that end, a transfer function of the analog-to-digital unit is determined. This transfer function may be extracted from a response characteristic of the analog-to-digital converter unit, that is, based on the input signal and the output signal. A fault is ascertained when a deviation between the determined transfer function and the predefined target transfer function is greater than a predefined reference value. If a fault is ascertained, a fault signal is output. It is particularly advantageous that the test may be carried out only for individual points of the transfer function, for example, at the zero point. This simplifies the implementation of the test.

The occurrence of dead bands in the transfer function is attributable particularly to small controller gains within the closed loop. Thus, according to the present invention, instead of the direct input-output behavior of the delta-sigma modulation, only the controller gain is checked. If an interference signal is applied, in the ideal case, this should thus be corrected by the closed loop. On the other hand, if the closed loop is defective and therefore has too small a controller gain, then a deviation remains in the digital output signal which may be determined reliably with the aid of the method described above. Therefore, it may be determined easily and with low expenditure, whether a fault is present in the analog-to-digital converter unit.

Preferred further developments of the present invention are disclosed herein.

The analog-to-digital converter unit preferably has a loop filter and a quantizer as parts of the delta-sigma modulation. The predefined interference signal is applied between the loop filter and the quantizer. Thus, the interference signal acts directly on the quantization, but is not influenced by other components of the delta-sigma modulation. At the same time, the method may be implemented easily and with little effort, since an interference signal is to be applied to the analog-to-digital converter unit at only one predefined location.

The interference signal is advantageously an offset signal, which may be realized by a DC voltage. Alternatively or additionally, the interference signal is advantageously a sinusoidal signal and/or a pseudorandom noise. Depending on information available about the above-described loop filter, especially advantageous interference signals may be determined in order to carry out the method in particularly efficient manner. In the simplest case, however, it is sufficient to apply only an offset signal as interference signal in order to thus determine the behavior of the closed loop of the delta-sigma modulation, and consequently the conversion quality of the entire analog-to-digital converter unit.

A fault becomes apparent particularly due to a plateau of a transfer function of the analog-to-digital converter unit. The plateau visualizes the above-described dead band, since a clear-cut assignment of one output signal to one incoming input signal is not possible at this location. In this case, the test result and/or the additional test result and/or the difference between the test result and additional test result are a measure for the plateau.

According to an example embodiment of the present invention, in addition, after applying the predefined interference signal, preferably the negated predefined interference signal is applied to the analog input signal, and the resulting digital output signal is stored as additional test result. In this way, the method may be carried out particularly advantageously, since a fault is present when the difference between the test result and additional test result is greater than a predefined reference value. Dead bands within the transfer function may thus be detected safely and reliably, allowing a simple and low-expenditure test of the analog-to-digital converter unit.

Advantageously, an identical input signal is provided to determine the test result and the additional test result. As described above, one input signal is generated for test purposes. Therefore, preferably this input signal is generated in identical manner both for determining the test result and for determining the additional test result. Consequently, the only difference in determining the test result and the additional test result is the interference signal applied, so that all influences of this interference signal may be detected. As already described above, in the ideal case, a complete correction of the interference signal should be present, that is, a change of the output signal should not be detectable. On the other hand, if a change of the output signal lies above a predefined reference value, then it may be concluded that there is a fault in the analog-to-digital converter unit.

The present invention relates furthermore to an analog-to-digital converter unit. The analog-to-digital converter unit has a delta-sigma modulator which is equipped to convert an analog input signal and a digital output signal with the aid of the delta-sigma modulation. According to an example embodiment of the present invention, the analog-to-digital converter unit additionally has a self-test module, which is equipped to carry out the following activities: First of all, the self-test module is designed to generate an input signal. The input signal is to be used for the self-test of the delta-sigma modulator. Therefore, the generated input signal is output advantageously by the self-test module to an input of the delta-sigma modulator. In addition, the self-test module is designed to apply a predefined interference signal to the analog input signal. The self-test module is also equipped to store the resulting digital output signal as test result. Thus, the self-test module makes it possible to store as test result, the digital output signal which is realized in response to the presence of the generated input signal and the predefined interference signal. Finally, the self-test module is designed to determine a fault based on a deviation from a predefined target transfer function. To that end, the self-test module is designed to determine a transfer function of the analog-to-digital unit. This transfer function may be extracted from a response characteristic of the analog-to-digital converter unit, that is, based on the input signal and the output signal. The self-test module determines a fault when a deviation between the ascertained transfer function and the predefined target transfer function is greater than a predefined reference value. Finally, the self-test module is designed to output a fault signal in response to a recognized fault. The self-test module thus permits a reliable and efficient self-test of this delta-sigma modulator, whereby especially dead bands in the transfer function of the delta-sigma modulator and therefore of the analog-to-digital converter unit are able to be detected reliably. The details of the mechanism of the detection procedure were already described above, so that at this point, reference is made to the above disclosure.

According to an example embodiment of the present invention, the delta-sigma modulator particularly advantageously has a loop filter and a quantizer. Between the loop filter and the quantizer, preferably a coupling point is provided at which the interference signal is able to be applied. Thus, an inexpensive and uncomplicated realization of the self-test module is achieved, since only a minimal modification of the delta-sigma modulator is necessary, namely, the insertion of the aforementioned coupling point between the quantizer and loop filter. The interference signal may be applied reliably to the input signal through this coupling point, so that the interference signal acts directly on the quantizer, but is not influenced by other components of the delta-sigma modulator. Efficient testing of the delta-sigma modulator is thereby made possible.

The self-test module is designed preferably to supply an offset signal and/or a sinusoidal signal and/or a pseudorandom noise as interference signal. These various signal types have different advantages, which were already explained specifically above, so that at this point reference is made to the above disclosure.

According to an example embodiment of the present invention, the self-test module is designed preferably to determine in the closed loop, a fault which leads to a plateau in a transfer function of the analog-to-digital converter unit. The transfer function is thus preferably the transfer function of the delta-sigma modulator or of the analog-to-digital converter unit. In this context, the plateau visualizes the dead band in the transfer function described above. In this case, the test result and/or the additional test result and/or the difference between the test result and additional test result represent a measure for the plateau. Thus, the plateau or the dead band in the transfer function may be inferred easily and with little effort based on the ascertained parameters, no clear-cut assignment of input signal and output signal being possible at said plateau or in said dead band, since, namely, multiple different input signals are converted into the same output signal. Therefore, reliable and efficient ascertainment of faults in the delta-sigma modulator is achieved.

After the predefined interference signal is applied, the self-test module is equipped advantageously to apply the negated predefined interference signal to the analog input signal. The self-test module is also equipped to store the resulting digital output signal as additional test result. Thus, two different results are received by the self-test module, which were realized from the faulted analog input signal in response to the application of the interference signal and the negated interference signal. The self-test module is therefore designed to determine a fault if a difference between the test result and additional test result is greater than a predefined reference value. In this way, the self-test module is able to detect the fault reliably and with low expenditure.

According to an example embodiment of the present invention, the self-test module is designed advantageously to generate an identical input signal during the ascertainment of the test result and the additional test result. Thus, the test result and the additional test result are ascertained based on the same basic conditions, only the interference signal being different. Since in the ideal case the interference signal would be completely corrected, in the ideal case a change of the output signal is thus to be expected, such that the difference between the test result and additional test result should become zero. However, if this difference lies above a predefined reference value, then a defect of the delta-sigma modulator must be assumed, since the closed loop of the delta-sigma modulator has too small a gain, which is not sufficient to correct the interference signals. Therefore, a defect and consequently a fault of the delta-sigma modulator, thus, of the analog-to-digital converter unit may be detected reliably.

BRIEF DESCRIPTION OF THE DRAWINGS

In the following, exemplary embodiments of the present invention are described in detail with reference to the figures.

DETAILED DESCRIPTION OF EXAMPLE EMBODIMENTS

Figure 1:
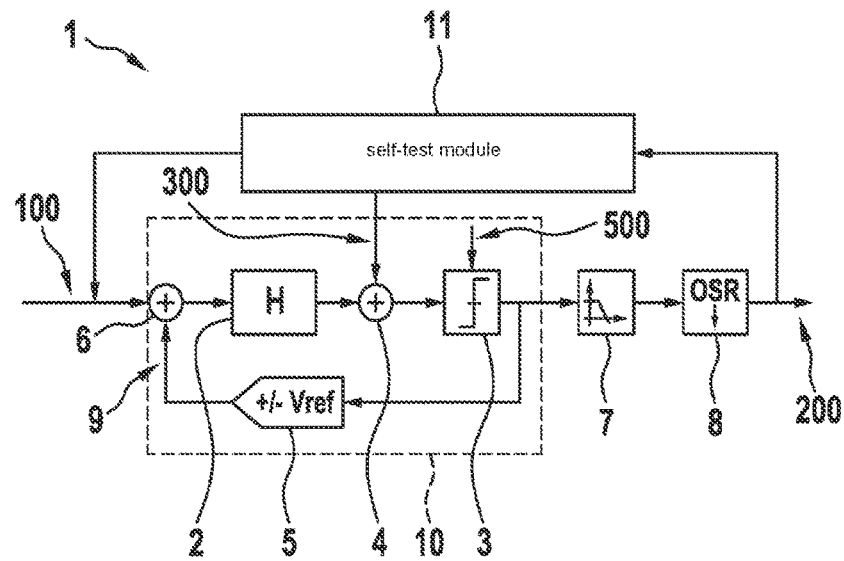
FIG. 1 shows a schematic view of an analog-to-digital converter unit according to one exemplary embodiment of the present invention.

FIG. 1 shows schematically an analog-to-digital converter unit 1 according to one exemplary embodiment of the present invention. Analog-to-digital converter unit 1 has a delta-sigma modulator 10 as well as a self-test module 11. Delta-sigma modulator 10 is equipped to convert an analog input signal 100 into a digital output signal 200 with the aid of the delta-sigma modulation. In addition, analog-to-digital converter unit 1 may advantageously have a low-pass filter 7 as well as a sampling-rate converter 8, which act upon output signal 200. However, the last two components are not relevant for the exemplary embodiment according to the present invention, and are therefore not described more precisely hereinafter.

Delta-sigma modulator 10 has a loop filter 2 and a quantizer 3, so that after passing through loop filter 2, input signal 100 is converted by quantizer 3 into a digital signal. For example, quantizer 3 may be a comparator which compares the input signal to a predefined reference signal 500. A closed loop is implemented by a feedback loop 9, which is used to correct the quantization error of quantizer 3. To that end, analog input signal 100 is superimposed with the fed-back signal at a feedback point 6, the fed-back signal being converted by a digital-to-analog converter 5 into an analog signal. Digital-to-analog converter 5 utilizes output signal 200 output by quantizer 3 and converts it again into an analog signal, this being accomplished advantageously only by 1/bit conversion, so that a reference voltage $V_{Ref}$ either with positive sign or with negative sign is superimposed on analog signal 100.

In order to detect a fault in delta-sigma modulator 10, loop filter 2 is examined in particular. This loop filter 2 usually has at least one integrator, by which the quantization errors are integrated in order to be able to correct them. If a gain of this integrator is too small, then a controller gain of the closed loop of delta-sigma modulator 10 is not sufficient. A controller gain is too small particularly in the case of a defect of delta-sigma modulator 10. This is able to be determined with the aid of self-test module 11.

Self-test module 11 is used first of all to generate an input signal 100 which is intended to be used for test purposes. In addition, self-test module 11 is used to generate an interference signal 300. Interference signal 300 is applied at a coupling point 4 between loop filter 2 and quantizer 3. Thus, interference signal 300 acts directly on quantizer 3, thereby avoiding an influencing of other components of delta-sigma modulator 10. In the case of a functioning closed loop, delta-sigma modulator 10 corrects this interference signal 300, so that no or virtually no change at all is detectable at output signal 200. However, if a controller gain is not sufficient, then a correction cannot be carried out.

Therefore, self-test module 11 is equipped to first of all apply predefined interference signal 300, in order to store resulting output signal 200 as test result. In addition, self-test module 11 is designed to apply negated predefined interference signal 300, in order to store resulting output signal 200 as additional test result. During the ascertainment of the test result and the additional test result, generated input signal 100 remains identical. The only difference between the test result and the additional test result is therefore that different interference signals 300 were present while acquiring these results.

As described before, in the ideal case, it is expected that no change of output signal 200 at all is present in response to interference signal 300. Therefore, a difference between the test result and the additional test result is formed by self-test module 11. If this difference is greater than a predefined reference value, this may then be attributed to a defect of the control and therefore a defect of delta-sigma modulator 10. In this case, self-test module 11 is designed to output a fault signal. Thus, a particularly simple special case of the general principle is described here, in which a transfer function is deduced based on the response characteristic of analog-to-digital converter unit 1, this transfer function being compared to a predefined target transfer function. If a deviation is greater than a predefined reference value, then said defect is determined.

In the simplest case, interference signal 300 is an offset signal that is generated by DC voltage. Likewise, interference signal 300 may also be a sinusoidal signal and/or a pseudorandom noise. Depending on information available about loop filter 2, various interference signals 300 may be used to permit optimal testing.

In an alternative development, the applying of negated interference signal 300 may be omitted. This is especially the case when interference signal 300 is not a simple offset signal.

Figure 2:
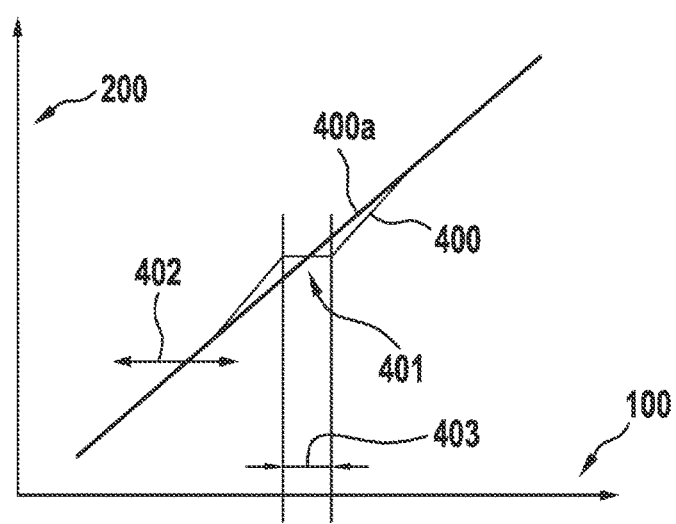
FIG. 2 shows a schematic view of an ideal as well as a real transfer function of the analog-to-digital converter unit according to the exemplary embodiment of the present invention.

FIG. 2 shows a transfer function 400 of analog-to-digital converter unit 1, that is, a relationship between input signal 100 and output signal 200. If an ideal transfer function 400*a* were present, then each input signal 100 could be assigned unequivocally to one output signal 200, that is, each analog input signal 100 would be converted into a unique digital output signal 200. However, transfer function 400 may have a plateau 401, so that a dead band is produced. In this dead band, a clear-cut assignment of input signal 100 and output signal 200 cannot be ensured. This plateau 401 may be detected reliably with the aid of the method steps described above, which are carried out by the above-described self-test module 11. In this case, the test result and/or the additional test result and/or the difference between the test result and additional test result represent a measure for said plateau 401. In particular, a local shift 402 of transfer function 400 represented by plateau 401 may be determined based on these parameters. The following relationship prevails in particular: If interference signal 300 is described as $Q_{os}$, then the following influence on output signal 200, which is described hereinafter as $D_{out}$, may be expected:

$$D_{out} = kQ \; Q_{os}/H(f=0) + x$$

Herein kQ represents a gain of quantizer 3 and x represents digital output signal 200, which would be converted from input signal 100 without interference signal 300. Thus, a complete correction of interference signals 300 is to be expected only when the gain of the loop filter is adequately large. If this is not the case, then a correction cannot be carried out and plateau 401 remains, whose location may be determined on the basis of parameter $kQ \; Q_{os}/H(f=0)$. As described above, if a difference is formed from the test result and the additional test result, then the result is exactly this parameter, since the difference $D_{out}, 1 - D_{out}, 2$ leads to an elimination of value x identical in the case of identical input signal 100.

Besides location 402 of plateau 401, its width 403 may also be determined. An output of plateau 401 is implemented advantageously as the above-described fault signal in the event of a fault of delta-sigma modulator 10, that is, of analog-to-digital converter unit 1. Thus, a reliable and precise test of analog-to-digital converter unit 1 may be carried out in an easy manner. Namely, a fault is able to be detected quickly and reliably. In this case, self-test module 11 dependably outputs a corresponding fault signal.

What is claimed is:

1. A method for testing an analog-to-digital converter unit, which is configured to convert an analog input signal into a digital output signal using delta-sigma modulation, the method comprising:
   generating an analog input signal;
   applying a predefined interference signal to the analog input signal and storing a resulting digital output signal as a test result; and
   determining that a fault is present based on a transfer function of the analog-to-digital converter unit, which is ascertained from the test result and the input signal, having a deviation from a predefined target transfer function that is greater than a predefined reference value, a fault signal being output when a fault is determined;
wherein the analog-to-digital converter unit has a loop filter and a quantizer as parts of the delta-sigma modulation, the predefined interference signal being applied between the loop filter and the quantizer.

2. The method as recited in claim 1, wherein the interference signal is an offset signal and/or a sinusoidal signal and/or a pseudorandom noise.

3. A method for testing an analog-to-digital converter unit, which is configured to convert an analog input signal into a digital output signal using delta-sigma modulation, the method comprising:
generating an analog input signal;
applying a predefined interference signal to the analog input signal and storing a resulting digital output signal as a test result; and
determining that a fault is present based on a transfer function of the analog-to-digital converter unit, which is ascertained from the test result and the input signal, having a deviation from a predefined target transfer function that is greater than a predefined reference value, a fault signal being output when a fault is determined;
wherein after the predefined interference signal is applied, a negated predefined interference signal is applied to the analog input signal and a resulting digital output signal is stored as additional test result, a presence of the fault being determined based on a difference between the test result and additional test result being greater than a predefined reference value.

4. The method as recited in claim 3, wherein an identical input signal is provided for ascertaining the test result and the additional test result.

5. An analog-to-digital converter unit, comprising:
a delta-sigma modulator configured to convert an analog input signal into a digital output signal using delta-sigma modulation; and
a self-test module configured to perform the following:
generating an analog input signal,
applying a predefined interference signal to the analog input signal and store a resulting digital output signal as a test result, and
determining that a fault is present if a transfer function of the analog-to-digital converter unit, which is ascertained from the test result and the input signal, has a deviation from a predefined target transfer function which is greater than a predefined reference value, the self-test module being configured to output a fault signal if a fault is determined;
wherein the delta-sigma modulator has a loop filter and a quantizer, the predefined interference signal being applied via a coupling point between the loop filter and the quantizer.

6. The analog-to-digital converter unit as recited in claim 5, wherein the self-test module is configured to supply, as the interference signal, an offset signal and/or a sinusoidal signal and/or a pseudorandom noise.

7. An analog-to-digital converter unit, comprising:
a delta-sigma modulator configured to convert an analog input signal into a digital output signal using delta-sigma modulation; and
a self-test module configured to perform the following:
generating an analog input signal,
applying a predefined interference signal to the analog input signal and store a resulting digital output signal as a test result, and
determining that a fault is present if a transfer function of the analog-to-digital converter unit, which is ascertained from the test result and the input signal, has a deviation from a predefined target transfer function which is greater than a predefined reference value, the self-test module being configured to output a fault signal if a fault is determined;
wherein the self-test module is configured to, after the predefined interference signal has been applied, apply a negated predefined interference signal to the analog input signal and store a resulting digital output signal as an additional test result, a presence of the fault being determined if a difference between the test result and additional test result is greater than a predefined reference value.

8. The analog-to-digital converter unit as recited in claim 7, wherein the self-test module is configured to generate an identical input signal during ascertainment of the test result and the additional test result.

* * * * *